(12) United States Patent
Marchack et al.

(10) Patent No.: US 10,892,403 B2
(45) Date of Patent: Jan. 12, 2021

(54) STRUCTURED BOTTOM ELECTRODE FOR MTJ CONTAINING DEVICES

(71) Applicant: International Business Machines Corporation, Armonk, NY (US)

(72) Inventors: Nathan P. Marchack, New York, NY (US); Bruce B. Doris, Slingerlands, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/261,051

(22) Filed: Jan. 29, 2019

(65) Prior Publication Data

US 2020/0243758 A1 Jul. 30, 2020

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
CPC ..................... H01L 43/12; H01L 43/02; H01L 27/222–228; H01L 43/00–14; G11C 11/15; G11C 19/08; G11C 14/0036; G11C 14/0081
See application file for complete search history.

(56) References Cited

U.S. PATENT DOCUMENTS

| | | | |
|---|---|---|---|
| 6,828,639 B2 | 12/2004 | Nejad et al. | |
| 7,642,125 B2 | 1/2010 | Lung et al. | |
| 8,110,881 B2 | 2/2012 | Kao et al. | |
| 8,674,465 B2 | 3/2014 | Li et al. | |
| 8,883,520 B2 | 11/2014 | Satoh et al. | |
| 9,190,260 B1 | 11/2015 | Zhang et al. | |
| 9,450,180 B1 | 9/2016 | Annunziata et al. | |
| 9,705,071 B2 | 7/2017 | Annunziata et al. | |
| 2012/0243291 A1 | 9/2012 | Gopalakrishnan | |
| 2018/0040668 A1* | 2/2018 | Park | H01L 27/228 |
| 2018/0261759 A1 | 9/2018 | Bhosale et al. | |
| 2019/0148631 A1* | 5/2019 | Tien | H01L 43/08 257/421 |

* cited by examiner

*Primary Examiner* — Cuong B Nguyen
(74) *Attorney, Agent, or Firm* — Scully, Scott, Murphy & Presser, P.C.; L. Jeffrey Kelly, Esq.

(57) ABSTRACT

A bottom electrode structure for a magnetic tunnel junction (MTJ) containing device is provided. The bottom electrode structure includes a mesa portion that is laterally surrounded by a recessed region. The recessed region of the bottom electrode structure is laterally adjacent to a dielectric material, and a MTJ pillar is located on the mesa portion of the bottom electrode structure. Such a configuration shields the recessed region from impinging ions thus preventing deposition of resputtered conductive metal particles from the bottom electrode onto the MTJ pillar.

11 Claims, 3 Drawing Sheets

STRUCTURED BOTTOM ELECTRODE FOR MTJ CONTAINING DEVICES

BACKGROUND

The present application relates to a magnetic tunnel junction (MTJ) containing device and a method of forming the same. More particularly, the present application relates to a MTJ containing device that includes a magnetic tunnel junction (MTJ) pillar located on a mesa portion of a bottom electrode structure, the mesa portion is laterally surrounded by a recessed region of the bottom electrode structure.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnetic set to a particular polarity; the other plate's magnetization can be changed to match that of an external field to store memory. Such a configuration is known as a magnetic tunnel junction (MTJ) pillar.

In such MTJ containing devices, the bottom electrode that is connected to the MTJ pillar can be a source of resputtered conductive metal particles that can deposit on a sidewall of the MTJ pillar, especially when an ion beam etching (IBE) process is used to clean the sidewall of the MTJ pillar. If resputtered conductive metal particles deposit on the tunnel barrier material of the MTJ pillar, electrical shorts may arise, which is a common failure mode. This problem is particularly apparent when the critical dimension (CD) of the bottom electrode exceeds that of the MTJ pillar, which is not an unlikely occurrence due to the difficulty in maintaining circularity at small CDs for hole features.

There is thus a need for a method that can prevent the deposition of such resputtered conductive metal particles from the bottom electrode on the sidewall of the MTJ pillar.

SUMMARY

A bottom electrode structure for a magnetic tunnel junction (MTJ) containing device is provided. The bottom electrode structure includes a mesa portion that is laterally surrounded by a recessed region. The recessed region of the bottom electrode structure is laterally adjacent to a dielectric material, and a MTJ pillar is located on the mesa portion of the bottom electrode structure. Such a configuration shields the recessed region from impinging ions thus preventing deposition of resputtered conductive metal particles from the bottom electrode onto the MTJ pillar. Secondly, as the predominantly exposed surface of the bottom electrode structure in the recessed region is now nearly vertical rather than horizontal, the angle of resputtering changes such that deposition of resputtered conductive metal particles becomes less likely.

In one aspect of the present application, a magnetic tunnel junction (MTJ) containing device such as, for example, a memory device or a sensor is provided. In one embodiment, the MTJ containing device includes a MTJ pillar located on a mesa portion of a bottom electrode structure, wherein the mesa portion is laterally surrounded by a recessed region of the bottom electrode structure. By "laterally surrounded" it is meant that the recessed region is located on the perimeter of the mesa portion. A dielectric material is located laterally adjacent to the recessed region, and a top electrode is located on the MTJ pillar.

In another aspect of the present application, a method of forming a magnetic tunnel junction (MTJ) containing device is provided. In one embodiment, the method includes forming a structure including a dielectric material located adjacent to a bottom electrode having an entirely planar topmost surface, a multilayered magnetic tunnel junction (MTJ) stack located on a portion of the entirely planar topmost surface of the bottom electrode and a top electrode located on the multilayered MTJ stack. The multilayered MTJ stack is then etched to provide a MTJ pillar. Next, a passivation material spacer is formed on sidewalls of each of the top electrode and the MTJ pillar. The physically exposed portion of the bottom electrode is then recessed to provide a bottom electrode structure containing a mesa portion and a recessed region laterally surrounding the mesa portion. In some embodiments, a dielectric material layer is formed to fill in the recessed region of the bottom electrode structure.

DETAILED DESCRIPTION

Figure 1:
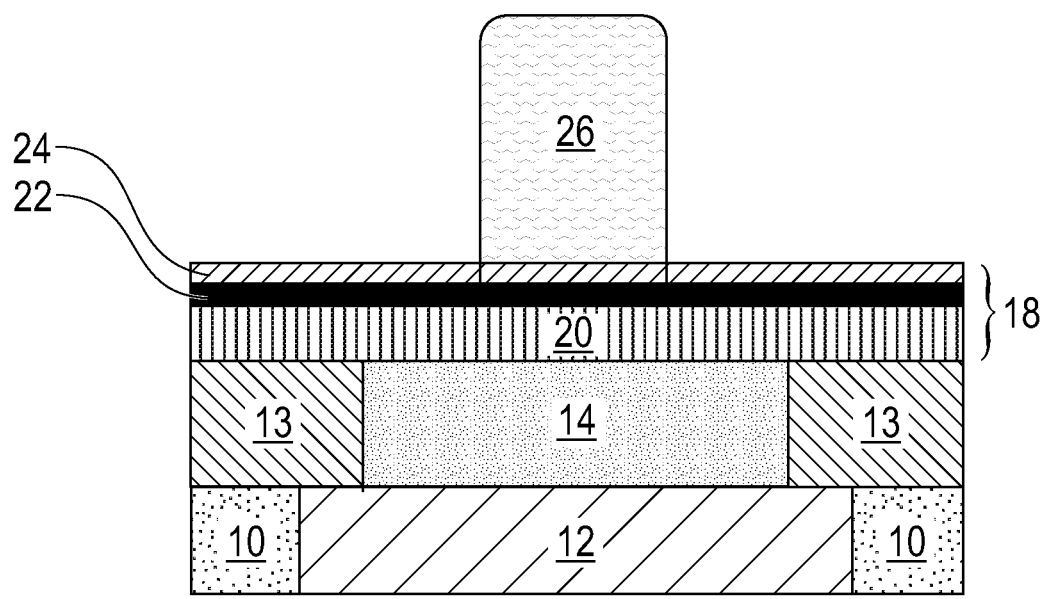
FIG. 1 is a cross sectional view of an exemplary MTJ containing device of the present application and during an early stage of fabrication, the MTJ containing device including a dielectric material located adjacent to a bottom electrode having an entirely planar topmost surface, a multilayered magnetic tunnel junction (MTJ) stack located on a portion of the entirely planar topmost surface of the bottom electrode and a top electrode located on the multilayered MTJ stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary magnetic tunnel junction (MTJ) containing device of the present application and during an early stage of fabrication. Exemplary MTJ containing devices include, but are not limited to, memory devices (e.g., MRAM or spin-transfer torque (STT) MRAM), or sensors such as, for example, pressure sensors. Notably, the exemplary MTJ containing device shown in FIG. 1 includes a dielectric material located adjacent to a bottom electrode 14 having an entirely planar topmost surface, a multilayered magnetic tunnel junction (MTJ) stack 18 located on a portion of the entirely planar topmost surface of the bottom electrode 14 and a top electrode 26 located on the multilayered MTJ stack 18.

It is noted that the drawings of the present application illustrate a device area in which a MTJ containing device will be formed. A non-MTJ containing device area may be located adjacent to the MTJ containing device area illustrated in the drawings of the present application. It is also noted that while a single bottom electrode 14 and a single top electrode 26 are described and illustrated, the present application can be used when a plurality of bottom electrodes 14 and a plurality of top electrodes 26 are formed.

As is shown, the bottom electrode 14 is located on a surface of an electrically conductive structure 12 that is embedded in an interconnect dielectric material layer 10. Although not shown, a diffusion barrier liner can be formed on the sidewalls and bottom wall of the electrically conductive structure 12. Collectively, the electrically conductive structure 12, the diffusion barrier liner (if present), and the interconnect dielectric material layer 10 provide an interconnect level. It is noted that at least one other interconnect level and/or a middle-of-the-line (MOL) level may be located beneath the interconnect level including the interconnect dielectric material layer 10, the electrically conductive structure 12, and, if present, the diffusion barrier liner. These other levels are not shown for clarity.

In the illustrated embodiment, the dielectric material that is located adjacent to the bottom electrode 14 is a dielectric capping material provided by dielectric capping layer 13. In another embodiment (not illustrated, but which can be derived readily from FIG. 1), the dielectric material that is located adjacent to the bottom electrode 14, is an upper portion of an interconnect dielectric material of an interconnect dielectric material layer 10. In such an embodiment, the dielectric capping layer 13 is omitted and the interconnect dielectric material layer 10 extends above electrically conductive structure 12 that is embedded in the interconnect dielectric material layer 10 such that the extended portion of the interconnect dielectric material layer 10 is located laterally adjacent to the bottom electrode 14. In either embodiment, the bottom electrode 14 has an entirely planar topmost surface that is coplanar with a topmost surface of the dielectric material that is located adjacent to the bottom electrode 14.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 12 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner is formed along the sidewalls and a bottom wall of the electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structure 12, and, if present, the diffusion barrier liner may be formed utilizing conventional processes that are well-known to those skilled in the art including, for example, a damascene process. So as not to obscure the method of the present application, the techniques used to form the interconnect level including the interconnect dielectric material layer 10, the electrically conductive structure 12, and, if present, the diffusion barrier liner are not provided herein.

In some embodiments (not shown), the bottom electrode 14 is located on a recessed surface of the electrically conductive structure 12. In such an embodiment, and prior to forming the bottom electrode 14, an upper portion of the electrically conductive structure 12 is removed utilizing a recess etching process, and thereafter the bottom electrode 14 is formed upon the recessed surface of the electrically conductive structure 12. In such an embodiment, the bottom electrode 14 would be located on an entirety of the recessed topmost surface of the electrically conductive structure 12. Also, and in such an embodiment, the bottom electrode 14 would have a topmost surface that is coplanar with a topmost surface of the interconnect dielectric material layer 10, and an upper portion of the interconnect dielectric material layer 10 would be laterally adjacent to each sidewall of the bottom electrode 14. Further, and in such an embodiment, dielectric capping layer 13 shown in FIG. 1 can be omitted from the structure.

In other embodiments and as illustrated in FIG. 1, the bottom electrode 14 is formed on a non-recessed surface of the electrically conductive structure 12. In such an embodiment, a dielectric capping layer 13 is located laterally adjacent to the bottom electrode 14 and on a surface of the interconnect dielectric material layer 10. In this embodiment, a smaller width bottom electrode 14 can be provided that does not cover the entirety of the topmost surface of the electrically conductive structure 12.

When present, the dielectric capping layer 13 may be composed of any dielectric material such as, for example, SiC, $Si_3N_4$, $SiO_2$, a carbon doped oxide, a nitrogen and hydrogen doped silicon carbide SiC(N,H) or multilayers thereof. The dielectric capping layer 13 can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD). In some embodiments, and as explained above, the dielectric capping layer 13 may be omitted from the exemplary MTJ containing device. In some embodiments and as is illustrated in FIG. 1, the bottom electrode 14 has a topmost surface that is coplanar with a topmost surface of a dielectric capping layer 13 that may be present laterally adjacent to the bottom electrode 14 and on a topmost surface of the interconnect dielectric material layer 10.

The dielectric capping layer 13 may be formed prior to, or after, forming the bottom electrode 14. In embodiments when the dielectric capping layer 13 is formed prior to the bottom electrode 14, a blanket layer of dielectric capping material is formed and thereafter an opening is formed (by photolithography and etching) in the dielectric capping material. The bottom electrode 14, as defined below, is then formed in the opening. In such an embodiment, the bottom electrode 14 is formed by deposition, followed by a planarization process. In embodiments in which the bottom electrode 14 is formed prior to the dielectric capping layer 13, the bottom electrode is formed by deposition and patterning, and thereafter the dielectric capping material is deposited and a subsequent planarization process may be performed.

Bottom electrode 14, which is present on a surface of the electrically conductive structure 12, may be composed of a conductive material such as, for example, Ta, TaN, Ti, TiN, Ru, RuN, RuTa, RuTaN, Co, CoWP, CoN, W, WN or any combination thereof. The bottom electrode 14 may have a thickness from 2 nm to 25 nm; other thicknesses are possible and can be used in the present application as the thickness of the bottom electrode 14. The bottom electrode 14 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 14.

The MTJ stack 18 includes at least a magnetic reference layer 20, a tunnel barrier layer 22, and a magnetic free layer 24 as configured in FIG. 1. Other MTJ stack 18 configurations are possible such as, for example, the magnetic free layer 24 being located at the bottom of the MTJ stack 18 and the magnetic reference layer 20 being at the top of the MTJ stack 18. In some embodiments (not shown), the MTJ stack 18 may also include a non-magnetic spacer layer located on the magnetic free layer, a second magnetic free layer located on the non-magnetic spacer layer, and/or a MTJ cap layer located on the magnetic free layer 24 or on the second magnetic free layer. The various material layers of the MTJ stack 18 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 20 has a fixed magnetization. The magnetic reference layer 20 may be composed of a metal or metal alloy (or a stack thereof) that includes one or more metals exhibiting high spin polarization. In alternative embodiments, exemplary metals for the formation of the magnetic reference layer 20 include iron, nickel, cobalt, chromium, boron, or manganese. Exemplary metal alloys may include the metals exemplified by the above. In another embodiment, the magnetic reference layer 20 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators.

The magnetic free layer 24 may be composed of a magnetic material (or a stack of magnetic materials) with a magnetization that can be changed in orientation relative to the magnetization orientation of the magnetic reference layer 20. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer may include one of the magnetic materials mentioned above for magnetic free layer 24. In one embodiment, the second magnetic free layer is composed of a same magnetic material as the magnetic free layer 24. In another embodiment, the second magnetic free layer is composed of a magnetic material that is compositionally different from the magnetic free layer 24.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may have a thickness from 2 nm to 25 nm; other thicknesses are possible and can be used in the present application as the thickness of the MTJ cap layer.

The top electrode 26 may be composed of one of the conductive materials mentioned above for the bottom electrode 14. In one embodiment, the conductive material that provides the top electrode 26 is compositionally different from the bottom electrode 14. In another embodiment, the conductive material that provides the top electrode 26 is compositionally the same as the bottom electrode 14. In such an embodiment, a surface treatment process can be performed on the top electrode 26 to increase the top electrode's etch resistance, before the bottom electrode 14 is physically exposed. The conductive material that provides the top electrode 26 is typically compositionally different from the optional MTJ cap layer. The top electrode 26 can have a thickness within the thickness range mentioned above for the bottom electrode 14. The top electrode 26 may be formed utilizing one of the deposition processes mentioned above in providing the bottom electrode 14, followed by performing a patterning process, such as, for example, photolithography and etching.

Figure 2:
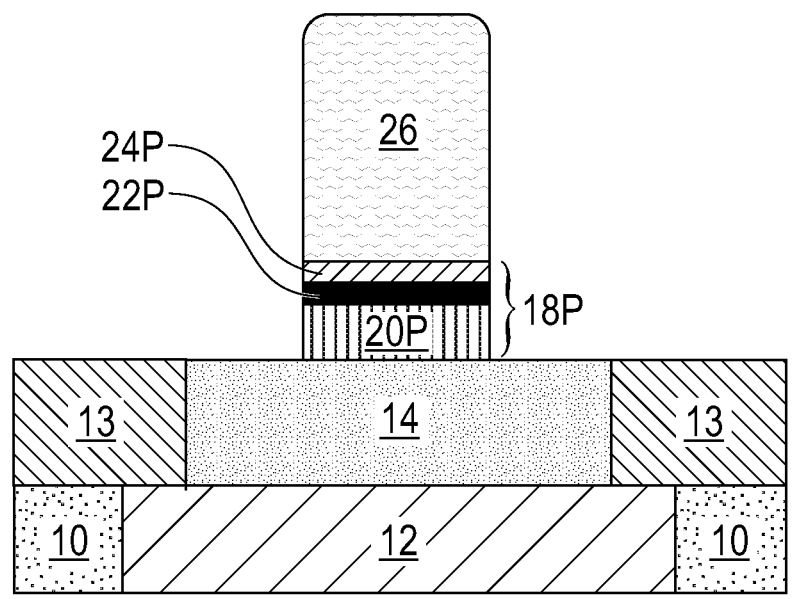
FIG. 2 is a cross sectional view of the exemplary MTJ containing device of FIG. 1 after etching the multilayered MTJ stack to provide a MTJ pillar.

Referring now to FIG. 2, there is illustrated the exemplary MTJ containing device of FIG. 1 after etching the multilayered MTJ stack 18 to provide a MTJ pillar 18P. The top electrode 26 is used as an etch mask during this step of the present application. The etching of the multilayered MTJ stack 18 comprises one or more etching processes. The one or more etching processed may include one or more reactive ion etching processes. The MTJ pillar 18P and the top electrode 26 are typically cylindrical in shape. However, other asymmetric shapes are possible and can be utilized in the present application.

The MTJ pillar 18P has a sidewall that is vertically aligned to the sidewall of the top electrode 26. The MTJ pillar 18P includes at least a remaining portion of the magnetic reference layer 20 (hereinafter magnetic reference material 20P), a remaining portion of the tunnel barrier layer 22 (hereinafter tunnel barrier material 22P) and a remaining portion of the magnetic free layer 24 (hereinafter magnetic free material 24P). In some embodiments, the MTJ pillar 18P may also include a remaining portion of the non-magnetic spacer, a remaining portion of the second magnetic reference layer, and/or a remaining portion of the MTJ cap layer.

As is shown in the drawing, this etch physically exposes a portion of the entirely planar topmost surface of the bottom electrode 14. The physically exposed portion of the entirely planar topmost surface of the bottom electrode 14 can be a source of conductive materials which during an angled IBE process used to clean the sidewall of the MTJ pillar 18P can be resputtered and deposited as conductive metal particles on the sidewall of the MTJ pillar 18P. As mentioned above, such resputtered conductive metal particles that deposit on the sidewall of the MTJ pillar causes electrical shorts. Thus, and in the present application, such an angled IBE is not performed at this stage of the present application.

Figure 3:
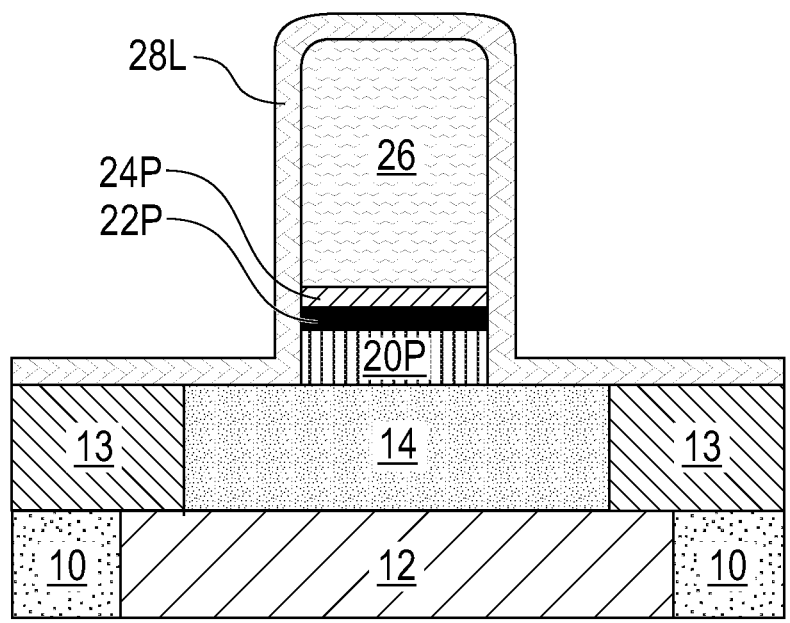
FIG. 3 is a cross sectional view of the exemplary MTJ containing device of FIG. 2 after forming a passivation material layer on the physically exposed surfaces of the top electrode and the MTJ pillar.

Referring now to FIG. 3, there is illustrated the exemplary MTJ containing device of FIG. 2 after forming a passivation material layer 28L on the physically exposed surfaces of the top electrode 26 and the MTJ pillar 18P. The passivation material layer 28L also extends onto the physically exposed surface of either the dielectric capping layer 13 or the interconnect dielectric material layer 10.

The passivation material layer 28L is composed of a dielectric material. In one example, the passivation material layer 28L is composed of silicon nitride. In another example, the passivation material layer 28L may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation material layer 28L may be composed of an nBLOK dielectric material that contains atoms of silicon, carbon, hydrogen, nitrogen and oxygen. In alternative example, the passivation material layer 28L may be composed of a SiBCN dielectric material that contains atoms of silicon, boron, carbon, hydrogen, and nitrogen.

The passivation material layer 28L can be formed utilizing a deposition process such as, for example, PECVD, PVD, or PEALD. The passivation material layer 28L may have a thickness from 10 nm to 200 nm. Other thicknesses are possible and can be employed as the thickness of the passivation material layer 28L. In some embodiments, the passivation material layer 28L has a conformal thickness. The term "conformal" denotes that a material layer has a vertical thickness along horizontal surfaces that is substantially the same (i.e., within ±5%) as the lateral thickness along vertical surfaces.

Figure 4:
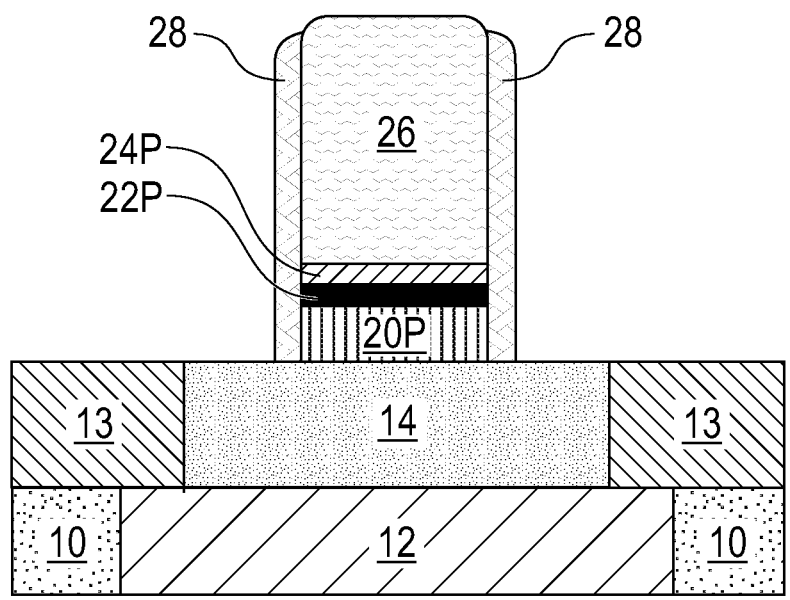
FIG. 4 is a cross sectional view of the exemplary MTJ containing device of FIG. 3 after etching the passivation material layer to provide a passivation material spacer on a sidewall of each of the top electrode and the MTJ pillar.

Referring now to FIG. 4, there is illustrated the exemplary MTJ containing device of FIG. 3 after etching the passivation material layer 28L to provide a passivation material spacer 28 on a sidewall of each of the top electrode 26 and the MTJ pillar 18P. As is shown, a bottommost surface of the passivation material spacer 28 is located on a portion of the entirely planar topmost surface of the bottom electrode 14. The etching of the passivation material layer 28L may be performed utilizing any spacer etching process such as, for example, reactive ion etching, that is selective for removing passivation material.

Figure 5:
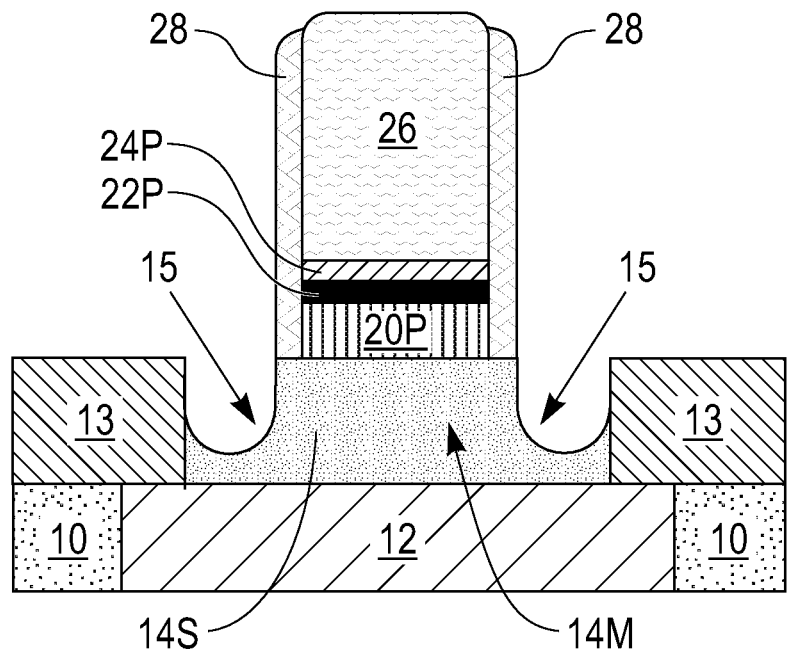
FIG. 5 is a cross sectional view of the exemplary MTJ containing device of FIG. 4 after recessing a physically exposed portion of the bottom electrode to provide a bottom electrode structure containing a mesa portion and a recessed region laterally surrounding the mesa portion.

Referring now to FIG. 5, there is illustrated the exemplary MTJ containing device of FIG. 4 after recessing a physically exposed portion of the bottom electrode 14 to provide a bottom electrode structure 14S containing a mesa portion 14M and a recessed region 15 laterally surrounding the mesa portion 14M. The mesa portion 14M has an entirely planar topmost surface which is coplanar with a topmost surface of the dielectric material that is located laterally adjacent to the recessed region 15. The recessed region 15 of the bottom electrode structure 14S has a concave surface as shown in FIG. 5. The concave surface of the recessed region is beneath the topmost surface of the mesa portion 14M as well as the topmost surface dielectric material that is located adjacent to bottom electrode structure 14S. The outermost sidewall of the mesa portion 14M is spaced apart from an innermost sidewall of the dielectric material that is adjacent to the recessed region 15 by a distance of 10 nm to 20 nm.

The recessing of the physically exposed portion of the bottom electrode 14 utilizes the passivation material spacer 28 and the top electrode 26 as a combined etch mask. The recessing may be performed utilizing a wet etching process or a dry etching process that selectively removes the conductive material of the bottom electrode 14 while minimally eroding both the aforementioned combined etch mask (passivation material spacer 28 and top electrode 26) and the physically exposed dielectric capping layer 13 or the interconnect dielectric material layer 10, if the dielectric capping layer 13 is not present. In one example, the recessing of the physically exposed portions of the bottom electrode 14 may be performed by an $HBr/O_2$ or $Cl_2/O_2$ based plasma etch, or a wet solution containing ammonium hydroxide, hydrogen peroxide and deionized water.

The recessed region 15 of the bottom electrode structure 14S has a critical dimension that exceeds that of the MTJ pillar 18P. The term "critical dimension" is used throughout the present application to denote the diameter of the feature. In one embodiment of the present application, the recessed region 15 of the bottom electrode structure 14S has a critical dimension from 40 nm to 80 nm, while the MTJ pillar 18P has a critical dimension from 20 nm to 50 nm.

FIG. 5 illustrates a MTJ containing device of the present application that includes a MTJ pillar 18P located on a mesa portion 14M of a bottom electrode structure 14S, wherein the mesa portion 14M is laterally surrounded by a recessed region 15 of the bottom electrode structure 14S. The mesa portion 14M has an entirely planar topmost surface. A dielectric material (either dielectric capping layer 13 or an upper portion of the interconnect dielectric material layer 10) is located laterally adjacent to the recessed region 15. A top electrode 26 is located on the MTJ pillar 18P.

At this point of the present, an angled IBE process can now be performed. Unlike the prior art, and due to the geometry of the MTJ containing device of the present application, substantially no conductive metal particles that may be resputtered from the bottom electrode structure 14S deposit on the sidewall of the MTJ pillar 18P thus reducing the possibility of electrical shorts caused by the redeposit conductive metal particles. Notably, the configuration of the MTJ containing device of the present application shields the recessed region 15 of the bottom electrode structure 14S from impinging ions thus preventing deposition of resputtered conductive metal particles from the bottom electrode structure 14S onto the MTJ pillar 18P. Thus, and in the present application, improved device performance, in terms of a reduction in failure mode, can be obtained.

Although not shown, another electrically conductive structure is formed contacting a surface of the top electrode 26. This other electrically conductive structure is embedded in another interconnect dielectric material that is formed laterally adjacent to, and above, the stack including, the MTJ pillar 18P, and the top electrode 26.

Figure 6:
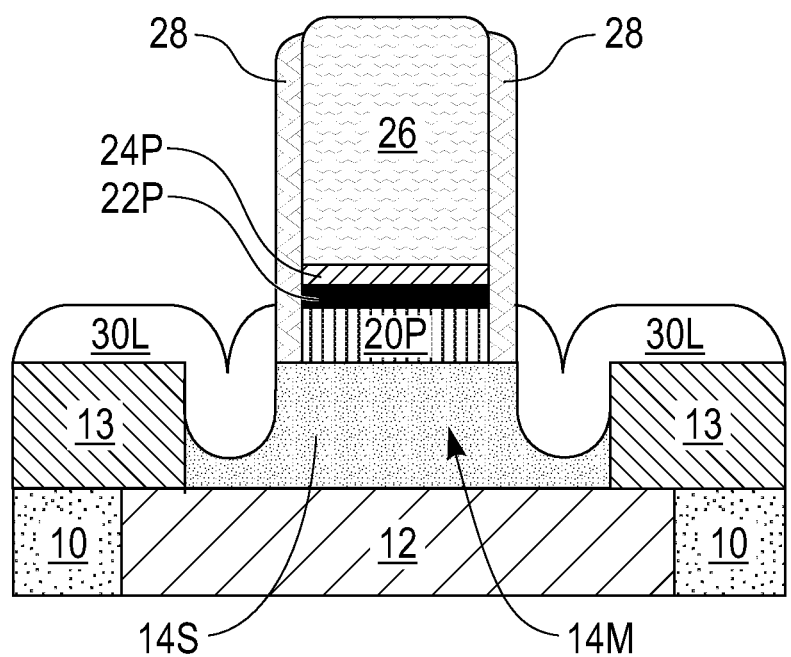
FIG. 6 is a cross sectional view of the exemplary MTJ containing device of FIG. 5 after forming a dielectric material layer to fill in the recessed region of the bottom electrode structure.

Referring now to FIG. 6, there is illustrated the exemplary MTJ containing device of FIG. 5 after forming a dielectric material layer 30L to fill in the recessed region 15 of the bottom electrode structure 14S. The dielectric material layer 30L may be composed of any dielectric material such as one of the dielectric materials mentioned above for the passivation dielectric material layer 28L. In one embodiment, the dielectric material layer 30L is composed of a compositionally same dielectric material as the passivation material layer 28L. In another embodiment, the dielectric material layer 30L is composed of a compositionally different dielectric material than the passivation material layer 28L. The dielectric material layer 30L may be formed utilizing any divot fill process that may include deposition and, an optional, recess etch.

The dielectric material layer 30L of the exemplary MTJ containing device shown in FIG. 6 completely shields the recessed region 15 of the bottom electrode structure 14S thus completely eliminating the likelihood of depositing resputtered conductive metal particles from the bottom electrode structure 14S onto the sidewall of the MTJ pillar 18P.

Although not shown, another electrically conductive structure is formed contacting a surface of the top electrode 26. This other electrically conductive structure is embedded in another interconnect dielectric material that is formed laterally adjacent to, and above, the stack including, the MTJ pillar 18P, and the top electrode 26.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction (MTJ) containing device comprising:
    a bottom electrode structure comprising a mesa portion and a laterally adjacent recessed region;
    a dielectric material located laterally adjacent to the recessed region of the bottom electrode structure;
    a MTJ pillar located on a topmost surface of the mesa portion of the bottom electrode structure;
    a top electrode located on the MTJ pillar; and
        a passivation material spacer located on a sidewall of each of the top electrode and the MTJ pillar, wherein a bottommost surface of the passivation material spacer is in direct physical contact with the topmost surface of the mesa portion of the bottom electrode structure.

2. The MTJ containing device of claim 1, wherein the topmost surface of the mesa region of the bottom electrode structure is coplanar with a topmost surface of the dielectric material that is located laterally adjacent to the recessed region.

3. The MTJ containing device of claim 1, wherein the bottom electrode structure is located on a surface of an electrically conductive structure.

4. The MTJ containing device of claim 3, wherein the electrically conductive structure is embedded in an interconnect dielectric material layer, and wherein an upper portion of the interconnect dielectric material layer provides the dielectric material that is located laterally adjacent to the recessed region.

5. The MTJ containing device of claim 1, wherein the dielectric material layer that is located laterally adjacent to the recessed region is a dielectric capping material layer.

6. The MTJ containing device of claim 1, wherein the recessed region of the bottom electrode structure has a concave surface.

7. The MTJ containing device of claim 1, wherein the MTJ pillar comprises a magnetic reference material, a tunnel barrier material, and a magnetic free material, wherein the magnetic reference material forms an interface with the mesa portion of the bottom electrode structure.

8. The MTJ containing device of claim 1, wherein the recessed region has a critical dimension that exceeds that of the MTJ pillar.

9. The MTJ containing device of claim 1, wherein no resputtered conductive metal particles are present on a sidewall of the MTJ pillar.

10. The MTJ containing device of claim 1, further comprising a dielectric material layer located on the dielectric material and present in, and completely filling, the recessed region of the bottom electrode structure, wherein a sidewall of the dielectric material layer directly contacts only a lower portion of the passivation material spacer.

11. A magnetic tunnel junction (MTJ) containing device comprising:
    a bottom electrode structure comprising a mesa portion and a laterally adjacent recessed region;
    a dielectric material located laterally adjacent to the recessed region of the bottom electrode structure;
    a MTJ pillar located on a topmost surface of the mesa portion of the bottom electrode structure;
    a top electrode located on the MTJ pillar; and a dielectric material layer located on the dielectric material and present in, and completely filling, the recessed region of the bottom electrode structure, wherein the dielectric material layer has a height that is less than a height of the MTJ pillar.

* * * * *